United States Patent
Streefkerk et al.

(10) Patent No.: US 7,961,293 B2
(45) Date of Patent: *Jun. 14, 2011

(54) LITHOGRAPHIC APPARATUS AND DEVICE MANUFACTURING METHOD

(75) Inventors: Bob Streefkerk, Tilburg (NL); Johannes Jacobus Matheus Baselmans, Oirschot (NL); Adrianus Franciscus Petrus Engelen, Waalre (NL); Jozef Maria Finders, Veldhoven (NL); Paul Graeupner, Aalen (DE); Johannes Catharinus Hebertus Mulkens, Waalre (NL); Jan Bernard Plechelmus Van Schoot, Eindhoven (NL)

(73) Assignees: ASML Netherlands B.V., Veldhoven (NL); Carl Zeiss SMT GmbH, Oberkochen (DE)

( * ) Notice: Subject to any disclaimer, the term of this patent is extended or adjusted under 35 U.S.C. 154(b) by 386 days.

This patent is subject to a terminal disclaimer.

(21) Appl. No.: 12/076,307

(22) Filed: Mar. 17, 2008

(65) Prior Publication Data

US 2008/0170215 A1 Jul. 17, 2008

Related U.S. Application Data

(63) Continuation of application No. 10/964,816, filed on Oct. 15, 2004, now Pat. No. 7,352,435.

(30) Foreign Application Priority Data

Oct. 15, 2003 (EP) .................................... 03256498

(51) Int. Cl.
*G03B 27/42* (2006.01)
*G03B 27/52* (2006.01)

(52) U.S. Cl. ............................................ 355/53; 355/30
(58) Field of Classification Search .................... 355/30, 355/53, 55, 67–71; 359/380, 649
See application file for complete search history.

(56) References Cited

U.S. PATENT DOCUMENTS

| | | | |
|---|---|---|---|
| 3,573,975 | A | 4/1971 | Dhaka et al. |
| 3,648,578 | A | 3/1972 | Stevens |
| 4,346,164 | A | 8/1982 | Tabarelli et al. |
| 4,390,273 | A | 6/1983 | Loebach et al. |
| 4,396,705 | A | 8/1983 | Akeyama et al. |
| 4,480,910 | A | 11/1984 | Takanashi et al. |
| 4,509,852 | A | 4/1985 | Tabarelli et al. |
| 5,040,020 | A | 8/1991 | Rauschenbach et al. |
| 5,194,893 | A | 3/1993 | Nishi |

(Continued)

FOREIGN PATENT DOCUMENTS

DE 206 607 2/1984

(Continued)

OTHER PUBLICATIONS

Notice of Reasons for Rejection for Japanese Patent Application No. 2008-120509 dated Mar. 27, 2009.

(Continued)

*Primary Examiner* — Hung Henry Nguyen
(74) *Attorney, Agent, or Firm* — Pillsbury Winthrop Shaw Pittman LLP

(57) ABSTRACT

In an immersion lithography apparatus or device manufacturing method, the position of focus of the projected image is changed during imaging to increase focus latitude. In an embodiment, the focus may be varied using the liquid supply system of the immersion lithographic apparatus.

25 Claims, 4 Drawing Sheets

U.S. PATENT DOCUMENTS

| | | | |
|---|---|---|---|
| 5,476,736 A | 12/1995 | Tanabe | |
| 5,610,683 A | 3/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 6,191,429 B1 | 2/2001 | Suwa | |
| 6,236,634 B1 | 5/2001 | Lee et al. | 369/112 |
| 6,281,966 B1 | 8/2001 | Kenmoku | |
| 6,560,032 B2 | 5/2003 | Hatano | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 6,844,206 B1 | 1/2005 | Phan et al. | |
| 6,980,277 B2 | 12/2005 | Sewell | |
| 7,352,435 B2 * | 4/2008 | Streefkerk et al. | 355/53 |
| 2002/0020821 A1 | 2/2002 | Van Santen et al. | 250/492 |
| 2002/0163629 A1 | 11/2002 | Switkes et al. | |
| 2003/0123040 A1 | 7/2003 | Almogy | |
| 2003/0174408 A1 | 9/2003 | Rostalski et al. | |
| 2004/0000627 A1 | 1/2004 | Schuster | |
| 2004/0021844 A1 | 2/2004 | Suenaga | |
| 2004/0075895 A1 | 4/2004 | Lin | |
| 2004/0109237 A1 * | 6/2004 | Epple et al. | 359/649 |
| 2004/0114117 A1 | 6/2004 | Bleeker | |
| 2004/0119954 A1 | 6/2004 | Kawashima et al. | |
| 2004/0125351 A1 | 7/2004 | Krautschik | |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2005/0018208 A1 | 1/2005 | Levinson | |
| 2005/0094116 A1 | 5/2005 | Flagello et al. | |
| 2005/0110973 A1 | 5/2005 | Streefkerk et al. | |
| 2005/0132914 A1 | 6/2005 | Mulkens et al. | |
| 2005/0134815 A1 | 6/2005 | Van Santen et al. | |
| 2005/0179877 A1 | 8/2005 | Mulkens et al. | |
| 2005/0264780 A1 | 12/2005 | Graeupner | |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0715213 A1 | 6/1996 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-277612 A | 10/1992 |
| JP | 04-305915 | 10/1992 |
| JP | 04-305917 | 10/1992 |
| JP | 06-124873 | 5/1994 |
| JP | 06-124874 A | 5/1994 |
| JP | 07-132262 | 5/1995 |
| JP | 07-220990 | 8/1995 |
| JP | 08-008157 A | 1/1996 |
| JP | 10-228661 | 8/1998 |
| JP | 10-255319 | 9/1998 |
| JP | 10-303114 | 11/1998 |
| JP | 10-340846 | 12/1998 |
| JP | 11-162824 A | 6/1999 |
| JP | 11-176727 | 7/1999 |
| JP | 2000-058436 | 2/2000 |
| JP | 2001-091849 | 4/2001 |
| JP | 2002-208551 A | 7/2002 |
| JP | 2003-178974 A | 6/2003 |
| JP | 2004-193252 | 7/2004 |
| JP | 2005-19864 A | 1/2005 |
| JP | 2006-114891 A | 4/2006 |
| WO | WO 99/49504 | 9/1999 |
| WO | WO99/49504 * | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "⅛μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolutions, depth of focus, and immersion lithography, *J. Microlith., Microfab., Microsyst.* 1(1):7-12 (2002).

Search Report for European Application No. 03256498.1, dated Jun. 22, 2004.

Notice of Reasons for Rejection for Japanese Patent Application No. 2008-120508 dated Mar. 27, 2009.

Japanese Office Action mailed Oct. 4, 2010 in related Japanese patent application No. 2008-120509.

Suwa et al. (Reissue Application of U.S. Patent No. 6,191,429 B1), U.S. Appl. No. 10/367,910, filed Feb. 19, 2003.

* cited by examiner

Fig. 4a
Fig. 4b
Fig. 4c
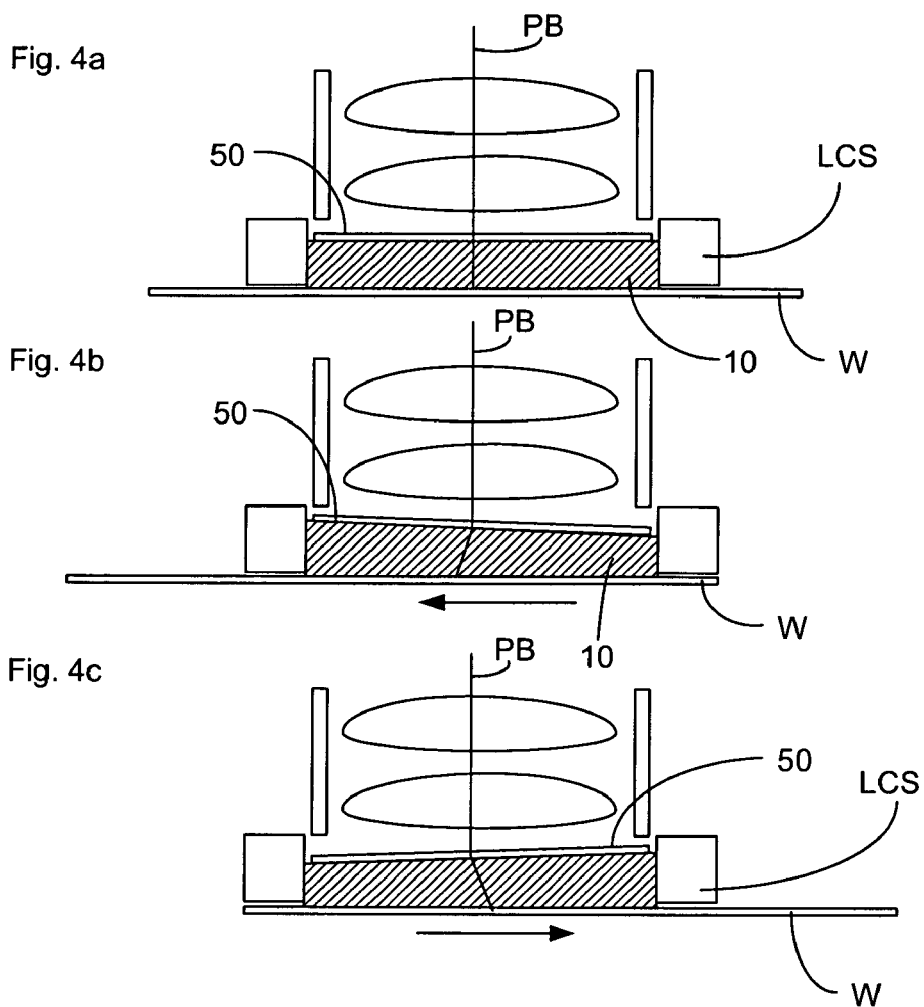
Fig. 4d
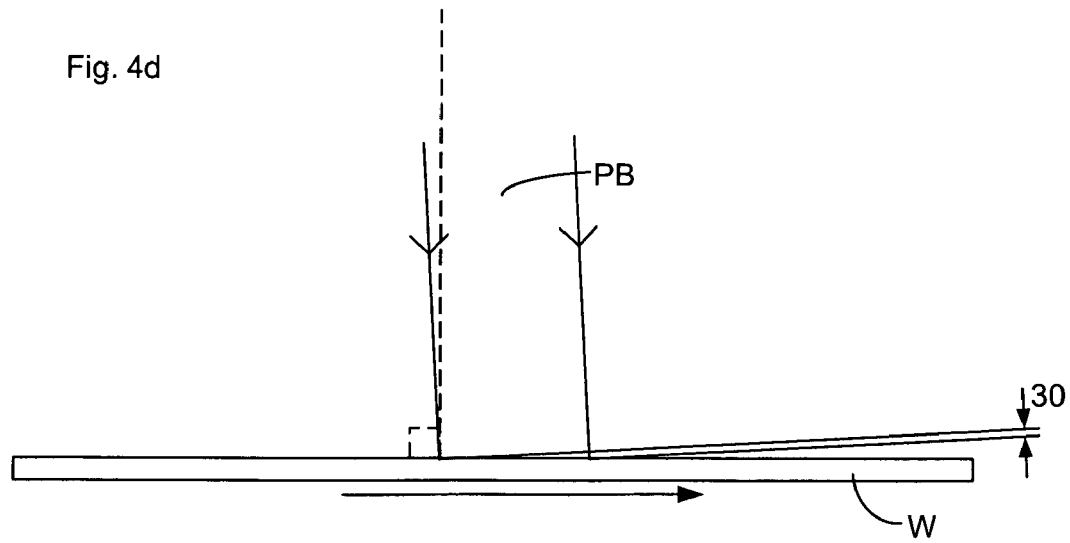

LITHOGRAPHIC APPARATUS AND DEVICE MANUFACTURING METHOD

RELATED APPLICATIONS

This is a continuation application of U.S. patent application Ser. No. 10/964,816, filed Oct. 15, 2004, now U.S. Pat. No. 7,352,435 which claims priority from European patent application EP 03256498.1, filed Oct. 15, 2003, the entire contents of each foregoing application is hereby incorporated by reference.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features because the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see, for example, United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Contrast changes in an imaged pattern may be a problem in lithographic apparatus. Contrast changes can occur as a result of laser band width variations, changes in levels of stray light, etc. Further, it often desirable to increase the focus latitude (the allowed variation in projection beam position of focus to obtain an imaged pattern with allowable resolution) in a lithographic apparatus.

SUMMARY

Accordingly, it would be advantageous, for example, to increase focus latitude and/or stabilize contrast control in immersion lithography.

According to an aspect of the invention, there is provided a lithographic apparatus, comprising:

an illumination system configured to condition a beam of radiation;

a support structure configured to hold a patterning device, the patterning device configured to impart the beam with a pattern in its cross-section;

a substrate table configured to hold a substrate;

a projection system configured to project the patterned beam onto a target portion of the substrate;

a liquid supply system configured to fill a space between the projection system and the substrate with a liquid; and a beam controller configured to focus the patterned beam at a plurality of positions relative to the substrate during projection of the patterned beam.

By focusing the patterned beam at a plurality of positions relative to the substrate during projection of the patterned beam, focus latitude may be increased for a fixed patterning device feature size so that the process window may be increased. By focusing the patterned beam at a plurality of positions (by, for example, varying the position of focus) during projecting of the patterned beam, throughput may not be deleteriously effected. With the same apparatus and/or method, the contrast control of the apparatus may be stabilized.

In an embodiment, the beam controller is configured to vary the position of focus by moving a final element of the projection system. In an immersion lithographic apparatus, the final element of the projection system is often a plane parallel plate which is used to seal the projection optics from the immersion liquid. By tilting the final element relative to other optical elements in the projection system and/or moving the final element in a direction substantially parallel to the optical axis of the apparatus, the position of the focus can easily be varied. This movement can be achieved by one or more actuators (a piezoelectric actuator may be suitable) or, in an embodiment, the final element is movable by action of pressure of the liquid. Using pressure of the liquid may make the projection system simple in design and the liquid supply system perform a dual function. The movement using the action of pressure of the liquid can be achieved by varying the input pressure of the liquid and/or by arranging that movement of the substrate is effective to generate the pressure. So, for example, when the substrate is scanned under the projection system, the movement of the substrate may be used to generate a force on the final element of the projection system through the liquid to vary the position of focus.

Immersion lithography also lends itself to varying the position of focus by using the controller to control the liquid supply system and vary the position of focus by altering the refractive index of the liquid. This can be achieved by a change in composition of the liquid and/or by a change in temperature of the liquid.

Alternatively or additionally, the position of focus may be varied by moving the substrate, by broadening the bandwidth of the projection beam and/or tilting the projection beam with respect to the substrate.

According to a further aspect of the invention, there is provided a device manufacturing method, comprising:

providing a liquid to a space between a projection system of a lithographic apparatus and a substrate;

projecting a patterned beam of radiation, using the projection system, through the liquid onto a target portion of the substrate; and focusing the patterned beam of radiation at a plurality of positions relative to the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 illustrates a first embodiment of the present invention;

DETAILED DESCRIPTION

Figure 1:
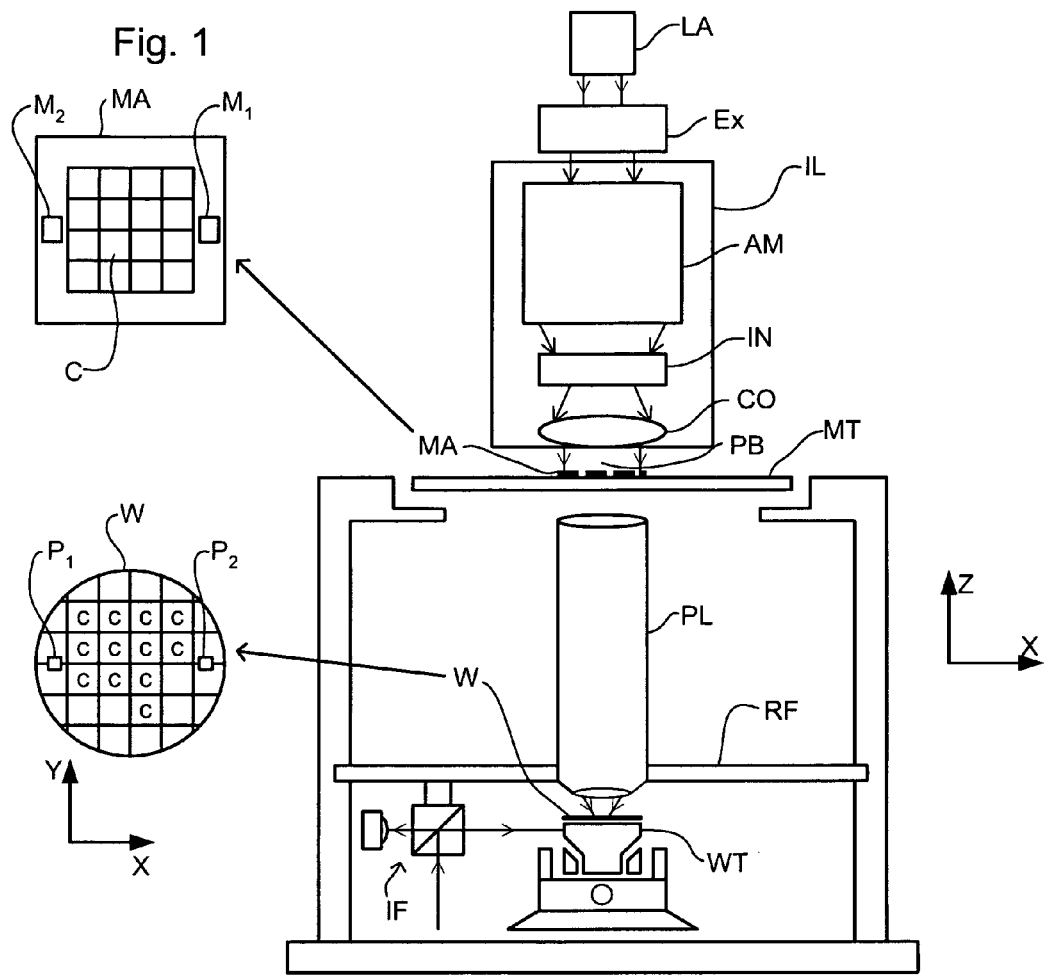
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation).

a first support structure (e.g. a mask table) MT for supporting a patterning device (e.g. a mask) MA and connected to a first positioning device PM for accurately positioning the patterning device with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Another immersion lithography solution with a localized liquid supply system solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in United States patent application no. U.S. Ser. No. 10/705,783, hereby incorporated in its entirety by reference.

While one or more embodiments of the invention are described in relation to increasing the focus latitude of the lithographic apparatus, one or more embodiments of the invention may equally be applicable to stabilizing the contrast of the lithographic apparatus.

To increase the focus latitude (although possibly at the expense of dose latitude), a technique called "focus drilling" has been proposed. In a form of focus drilling, the pattern is exposed a number of times on the surface of the substrate, each time with the pattern in a different focal plane. This may increase the depth of focus achievable for certain feature types. Although this "focus drilling" method may increase the focus latitude, it may be at the expense of a decrease in throughput as each image needs to be exposed multiple times.

It is possible to increase the focus latitude of a lithographic apparatus by focusing the projected pattern at a plurality of locations during scanning. A way of doing this in an immersion lithographic apparatus is illustrated in FIG. 4. Any method of filling a space between the final element 50 of the projection system PL and the substrate W may be employed. In FIG. 4, a liquid confinement system LCS (of a liquid supply system), such as disclosed in United States patent application U.S. Ser. No. 10/705,783, is used for illustration purposes.

FIG. 4a shows the projection beam PB passing through one or more lenses of the projection system PL and through the final element 50 of the projection system which is illustrated as a so-called "Abschlussplatte". The Abschlussplatte is a plane parallel plate which is used to seal the projection system PL from the immersion liquid 10. Other kinds of final element 50 may used including, for example, a lens.

In FIG. 4a, the final element 50 of the projection system PL is positioned orthogonally to the projection beam PB and the optical axis of the apparatus. If the final element 50 is tilted with respect to the optical axis of the apparatus, as is illustrated in FIGS. 4b and 4c, the angle of impingement of the projection beam PB on the substrate W can be varied away from orthogonal by a few 100 grads. In this way, when the substrate W is moved under the projection system PL during imaging (in a direction parallel to the top surface of the substrate), a continuous focus shift is experienced by every point on the substrate W. This is illustrated schematically in FIG. 4d and the focus shift is illustrated by arrows 30.

The final element 50 may be tilted using one or more piezoelectric actuators or other forms of actuator (active actuation). Conveniently in an immersion lithographic apparatus use may be made of a force generated in the immersion liquid 10 by movement of the substrate W under the projection system PL during imaging to move the final element 50 (passive actuation). This may be achievable by mounting the final element to the remainder of the projection system with a correct rigidity (which can be established by trial and error). In FIG. 4b, the substrate W is moving to the left as illustrated. This creates a build-up in pressure in the immersion liquid 10 on the left-hand side. If the projection system PL is assembled in the correct way, the extra build-up in pressure in the immersion liquid 10 on the left-hand side of the final element 50 may be effective to tilt the final element 50 away from its orthogonal relationship to the optical axis of the projection system. By tilting the final element 50 away from the optical axis, the projection beam PB exiting the final element 50 is also tilted or deflected away from the optical axis in the direction of movement of the substrate W. As is illustrated in FIG. 4d the tilting of the projection beam PB relative to the substrate W results in a continuous focus shift experienced by every point on the substrate. The amount of tilt needed is about 1 to 2 μm every 10 mm.

FIG. 4c illustrates the situation when the substrate W moves towards the right. In this case the pressure built-up in the immersion liquid 10 is also on the right-hand side as illustrated and so the final element 50 of the projection system PL is tilted in the opposite direction to that illustrated in FIG. 4b. The tilting of the final element 50 in the opposite direction results in the projection beam PB also being tilted in the opposite direction so that the introduced focus offset is in the direction of the scanning substrate W and a "focus drilling" can be achieved.

Tilting of the final element 50, if it is a plane parallel plate, would not have the effect of causing "focus drilling" in a non-immersion lithographic apparatus—it is the large optical path difference achievable with a refractive index larger than 1 which helps ensure the change in position of focus. The immersion liquid, when the final element is tilted, is like a wedge shaped optical element.

A similar effect may be achieved by moving the final element 50 in a direction substantially parallel to an optical axis of the lithographic apparatus. However, in such a case it may not be possible to continuously scan the substrate W. Several discrete images may need to be projected onto the substrate W at different focus levels. The different focus levels are achieved by varying the vertical height of the final element 50 and thus the amount of liquid between the final element 50 and the substrate W. Because the refractive index of the liquid is significantly greater than 1, the position of focus of the projection beam PB varies.

Figure 5:
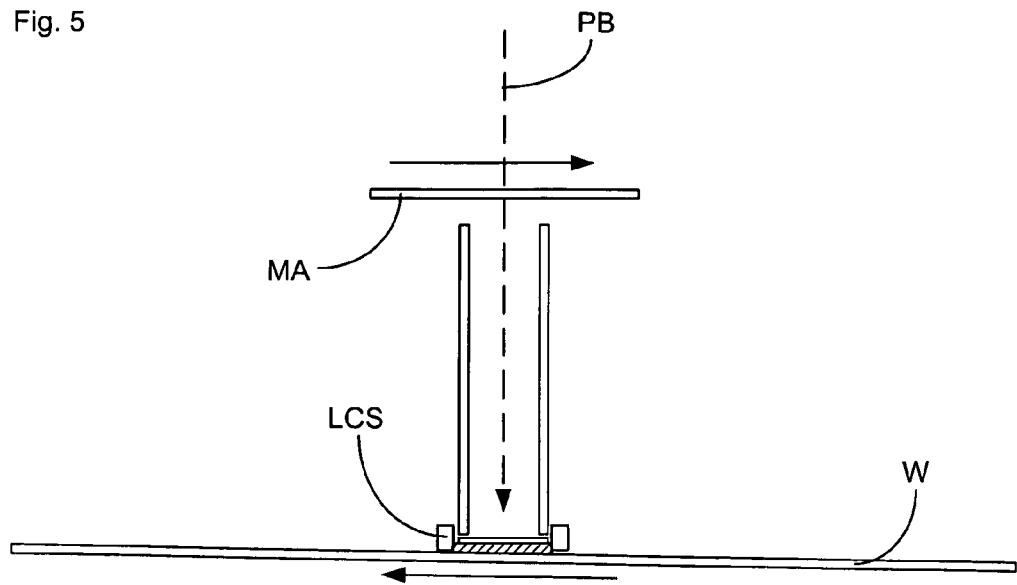
FIG. 5 illustrates a second embodiment of the present invention.

A second embodiment is illustrated schematically in FIG. 5. As with the first embodiment, the projection beam PB is tilted relative to the substrate W so that the projection beam does not project orthogonally onto the substrate surface. In the case illustrated in FIG. 5, this is achieved by tilting the substrate W relative to the projection system PL optical axis so that a continuous focus shift is experienced by every point on the substrate W as the substrate W is scanned under the projection system PL and the mask MA is scanned in the opposite direction above the projection system PL. During scanning, the target portion of the substrate W (which is changing in position on the substrate) remains a constant distance from the final element of the projection system PL.

The tilting of the substrate W by an amount of about 1 μm difference in vertical height between ends of the substrate, as is shown schematically in FIG. 5, may be achieved in an immersion lithographic apparatus. Indeed, the liquid supply systems described herein may work particularly well in this embodiment.

Figure 6:
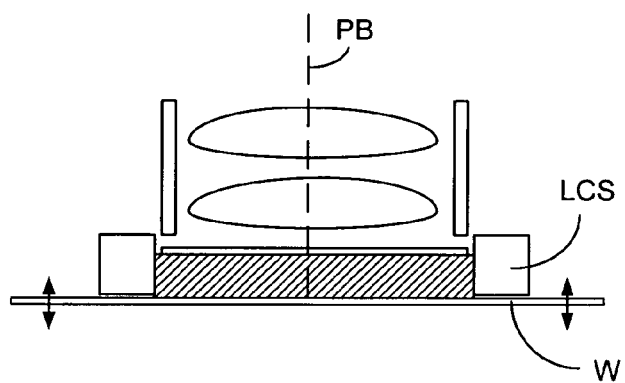
FIG. 6 illustrates a third embodiment of the present invention.

A third embodiment is illustrated in FIG. 6 and is the same as the first embodiment except as described below. In the third embodiment, the projection beam PB is maintained, as usual, on the optical axis of the projection system PL. However, in order to change the position of focus of the projection beam PB relative to the substrate W, the substrate W is moved up and down by about 1 μm in a direction substantially parallel to the optical axis as illustrated. This may be carried out during exposure of the substrate W wherein the substrate W is vibrated about 1 μm per slit scan at a frequency of a few cycles per exposure to less than the laser frequency (1-4 kH$_z$). Alternatively, multiple exposures, one at each position, may be carried out.

Fourth and fifth embodiments are the same as the first embodiment except it is the characteristics of the immersion liquid 10 which are varied in order to achieve the desired variation in position of focus of the patterned projection beam PB. As with the other embodiments, any liquid supply system may be used, though for the fourth embodiment, a liquid supply system, such as that illustrated in FIGS. 2 and 3, may be most suitable. For the fifth embodiment, a liquid confinement system LCS, such as that described in United States patent application U.S. Ser. No. 10/705,783, may be optimal.

Figure 2:
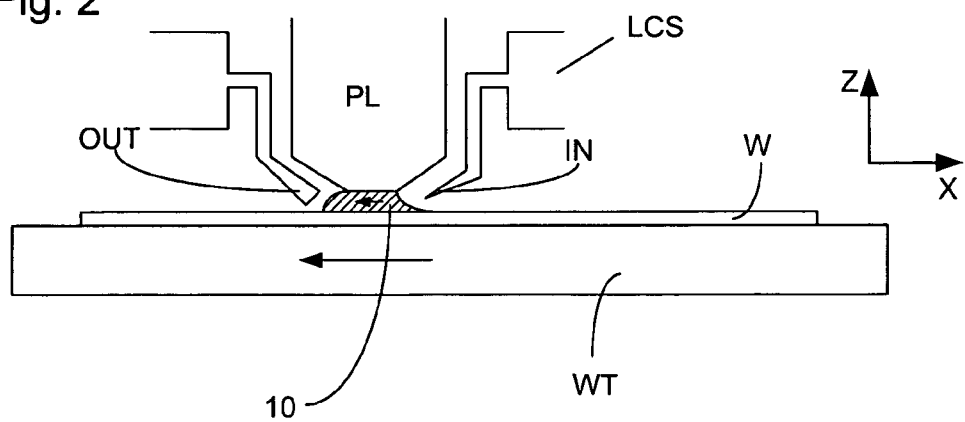
FIG. 2 illustrates, in cross-section, a liquid supply system according to an embodiment of the invention.
Figure 3:
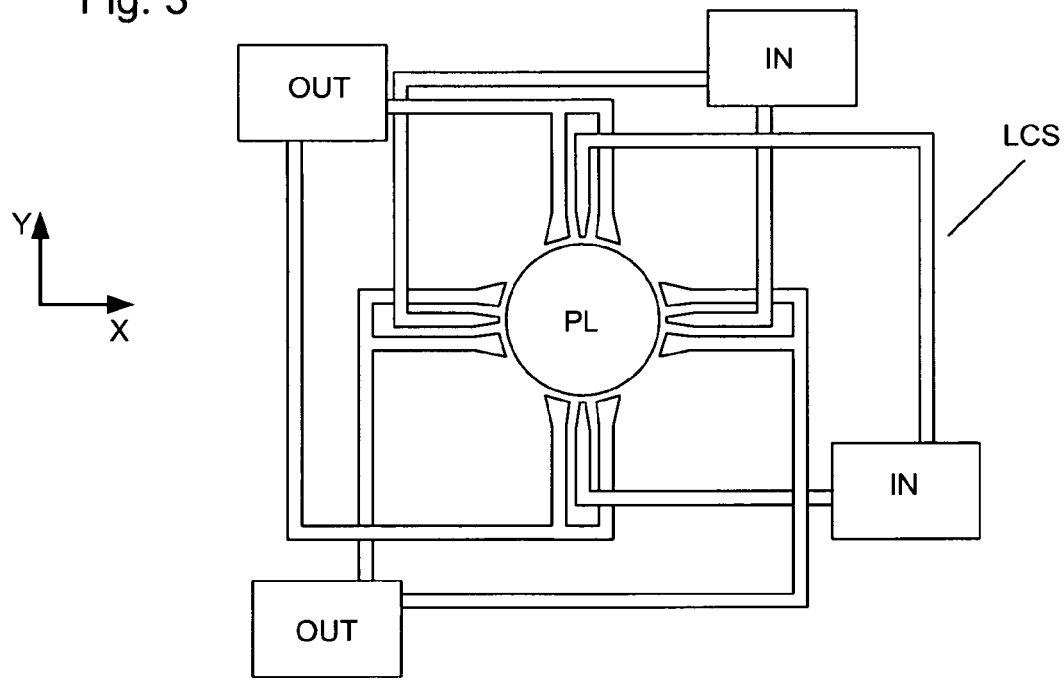
FIG. 3 depicts the liquid supply system of FIG. 2 in plan.

In the fourth and fifth embodiments, the refractive index of the immersion liquid 10 is varied with time. In particular, when the substrate W is scanned under the projection system PL during exposure the refractive index of the immersion liquid 10 is deliberately changed in the horizontal direction. One way of doing this, using the apparatus of FIG. 2, is to change the composition of liquid applied to the surface of the substrate W through inlet IN with time, for example, by using a continually varying binary composition of two liquids with different refractive indexes. This variation in refractive index will have the effect of varying the position of focus of the projected image relative to the substrate W to increase the focus latitude.

Figure 7:
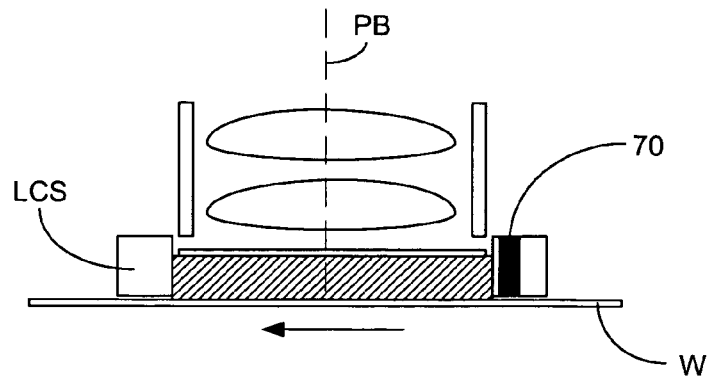
FIG. 7 illustrates a fifth embodiment of the present invention.

According the fifth embodiment as described with reference to FIG. 7, the variation of refractive index described above is also possible by varying the temperature of the immersion liquid. A heater 70 is provided on the liquid confinement system LCS or may be provided somewhere else in the liquid supply system. The heater 70 is effective to vary temperature in the horizontal direction, i.e. substantially parallel to the plane of the surface of the substrate W to be imaged during scanning. This variation in temperature has an effect of changing the refractive index of the immersion liquid 10 such that the position of focus of the projection beam PB relative to the substrate W varies as the substrate W is scanned under the projection system PL.

The systems of the fourth and fifth embodiments can be used on a continual scanning basis or for discrete multiple exposures at each different focus setting. The control can be feed forward or feedback by measuring the immersion liquid properties in the downstream or upstream direction.

Further ways of focusing the projection beam PB at a plurality of positions include varying the bandwidth of the projection beam PB by changing, for example, the composition of the gas in the laser generating the projection beam PB, changing the pressure of gas in the laser or by using a line narrowing unit. If refractive projection optics are used, the position of focus depends on the wavelength used (the lenses are said to have axial color). Thus, by increasing the bandwidth of the projection beam PB, multiple aerial images (one per wavelength) are imaged simultaneously. The same effect may be achieved by utilizing a plurality of projection beams of two or more different (substantially constant) wavelengths. The projection beams can be provided by the same source or different sources. The position of focus of the projection beam can also be varied by displacement, tilting or rotation of the mask.

It may also be possible to use a birefringent optical element (e.g., a lens) in the projection system PL such as a $CaF_2$ optical element. With a birefringent optical element, it is possible to image the substrate W at various positions of focus of the projection beam at the same time.

It will be appreciated that all of the above methods employ precise control of the variables to ensure that the correct amount of variation of position of focus is achieved. For this purpose, a beam controller is provided.

Any liquid supply system, whether a localized solution or not, can be used according to the one or more embodiments of the present invention. A liquid supply system may be any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

While specific embodiments of the invention have been described above, it will be appreciated that the invention may be practiced otherwise than as described. The description is not intended to limit the invention.

The invention claimed is:

1. A lithographic apparatus, comprising:
a support structure configured to hold a patterning device, the patterning device configured to impart a beam of radiation with a pattern in its cross-section;
a substrate table configured to hold a substrate;
a projection system configured to project the patterned beam onto a target portion of the substrate, the projection system comprising a movable optical element;
a liquid supply system configured to fill a space between the projection system and the substrate with a liquid, wherein the optical element is arranged, in use, to be in contact with the liquid; and
a controller configured to move the optical element while in contact with the liquid, the optical element being tiltable relative to other optical elements in the projection system.

2. The apparatus of claim 1, wherein the controller is configured to vary a position of focus by moving the optical element.

3. The apparatus of claim 1, wherein the optical element is movable by action of pressure of the liquid.

4. The apparatus of claim 3, wherein movement of the substrate is effective to generate the pressure.

5. The apparatus of claim 1, wherein the optical element is moveable in a direction substantially parallel to an optical axis of the apparatus.

6. The apparatus of claim 1, further comprising an actuator configured to move the optical element.

7. The apparatus of claim 1, wherein the optical element is a substantially plane parallel plate.

8. A device manufacturing method, comprising:
providing a liquid to a space between an optical element of a projection system of a lithographic apparatus and a substrate;
projecting a patterned beam of radiation, using the projection system, through the liquid onto a target portion of the substrate; and
tilting the optical element while in contact with the liquid relative to other optical elements in the projection system.

9. The method of claim 8, comprising focusing the patterned beam of radiation at a plurality of positions by moving the optical element.

10. The method of claim 8, comprising moving the optical element by action of pressure of the liquid on the optical element.

11. The method of claim 10, comprising generating the pressure in the liquid by movement of the substrate.

12. The method of claim 8, comprising moving the optical element in a direction substantially parallel to an optical axis of the lithographic apparatus.

13. The method of claim 8, wherein the optical element is a substantially plane parallel plate.

14. A lithographic apparatus, comprising:
a support structure configured to hold a patterning device, the patterning device configured to impart a beam of radiation with a pattern in its cross-section;
a substrate table configured to hold a substrate;
a projection system configured to project the patterned beam onto a target portion of the substrate, the projection system having an optical axis along which the patterned beam is focused and comprising a movable optical element;
a liquid supply system configured to fill a space between the projection system and the substrate with a liquid, wherein the optical element is arranged, in use, to be in contact with the liquid; and
a controller configured to move the substrate, the patterning device, or both the patterning device and substrate in a direction other than orthogonal to the optical axis throughout projection of the target portion through the liquid and to move the optical element while in contact with the liquid, the optical element being tiltable relative to other optical elements in the projection system.

15. The apparatus of claim 14, wherein the patterned beam is focused at a plurality of positions relative to the substrate during projection of the patterned beam by action of the liquid.

16. The apparatus of claim 14, wherein the controller is configured to move the substrate to achieve a tilt of up to 1 micrometer difference in vertical height between ends of the substrate.

17. A device manufacturing method, comprising:
providing a liquid to a space between an optical element of a projection system of a lithographic apparatus and a substrate;

patterning a radiation beam with a patterning device;

projecting the patterned beam of radiation, using the projection system, through the liquid along an optical axis onto a target portion of the substrate;

moving the substrate, the patterning device, or both the patterning device and substrate in a direction other than orthogonal to the optical axis throughout projecting of the target portion through the liquid; and tilting the optical element while in contact with the liquid relative to other optical elements in the projection system.

18. The method of claim 17, wherein the patterned beam is focused at a plurality of positions relative to the substrate during projecting of the patterned beam by action of the liquid.

19. The method of claim 17, comprising moving the substrate to achieve a tilt of up to about 1 micrometer difference in vertical height between ends of the substrate.

20. A lithographic apparatus, comprising:
- a support structure configured to hold a patterning device, the patterning device configured to impart a beam of radiation with a pattern in its cross-section;
- a substrate table configured to hold a substrate;
- a projection system configured to project the patterned beam onto a target portion of the substrate, the projection system having an optical axis along which the patterned beam is focused and comprising a movable optical element;
- a liquid supply system configured to fill a space between the projection system and the substrate with a liquid, wherein the optical element is arranged, in use, to be in contact with the liquid; and
- a controller configured to vibrate the substrate up and down in a direction substantially parallel to the optical axis at a frequency less than the laser frequency of the patterned beam throughout projection of the target portion through the liquid and to move the optical element while in contact with the liquid, the optical element being tiltable relative to other optical elements in the projection system.

21. The apparatus of claim 20, wherein controller is configured to vibrate the substrate by up to about 1 micrometer in the direction substantially parallel to the optical axis.

22. The apparatus of claim 20, wherein the frequency is less than 4 kH$_z$.

23. A device manufacturing method, comprising:
providing a liquid to a space between an optical element of a projection system of a lithographic apparatus and a substrate;

projecting the patterned beam of radiation, using the projection system, through the liquid along an optical axis onto a target portion of the substrate;

vibrating the substrate up and down in a direction substantially parallel to the optical axis at a frequency less than the laser frequency of the patterned beam throughout projecting of the target portion through the liquid; and tilting the optical element while in contact with the liquid relative to other optical elements in the projection system.

24. The method of claim 23, comprising vibrating the substrate by up to about 1 micrometer in the direction substantially parallel to the optical axis.

25. The method of claim 23, wherein the frequency is less than 4 kH$_z$.

* * * * *